(12) United States Patent
Huang et al.

(10) Patent No.: US 7,022,561 B2
(45) Date of Patent: Apr. 4, 2006

(54) CMOS DEVICE

(75) Inventors: Chien-Chao Huang, Hsin-Chu (TW); Chao-Hsing Wang, Hsin-Chu (TW); Chung-Hu Ge, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/307,619

(22) Filed: Dec. 2, 2002

(65) Prior Publication Data

US 2004/0104405 A1    Jun. 3, 2004

(51) Int. Cl.
*H01L 21/336* (2006.01)
*H01L 21/8238* (2006.01)

(52) U.S. Cl. ............... 438/197; 438/199; 438/787; 438/791

(58) Field of Classification Search ............ 438/189, 438/786–788, 791, 792, 197, 199
See application file for complete search history.

(56) References Cited

U.S. PATENT DOCUMENTS

| | | | |
|---|---|---|---|
| 5,562,770 A | 10/1996 | Chen et al. | 117/90 |
| 5,834,363 A | 11/1998 | Masanori | 438/507 |
| 6,271,054 B1 * | 8/2001 | Ballantine et al. | 438/60 |
| 6,281,532 B1 * | 8/2001 | Doyle et al. | 257/288 |
| 6,284,610 B1 | 9/2001 | Cha et al. | 438/300 |
| 6,403,482 B1 * | 6/2002 | Rovedo et al. | 438/689 |
| 6,444,566 B1 * | 9/2002 | Tsai et al. | 438/624 |
| 6,573,172 B1 * | 6/2003 | En et al. | 438/626 |
| 6,599,792 B1 * | 7/2003 | Jung | 438/199 |
| 6,678,307 B1 * | 1/2004 | Ezaki et al. | 372/96 |
| 6,737,308 B1 * | 5/2004 | Kim | 438/197 |
| 2002/0058186 A1 * | 5/2002 | Nozawa et al. | 430/5 |
| 2002/0175146 A1 * | 11/2002 | Dokumaci et al. | 216/88 |
| 2004/0099910 A1 * | 5/2004 | Choe et al. | 257/347 |
| 2004/0110377 A1 * | 6/2004 | Cho et al. | 438/689 |

OTHER PUBLICATIONS

J. Welser et al., *Strain Dependence of the Performance Enhancement in Strained-Si n-MOSFETs*, IEDM Tech, Dig., pp. 373-376, 1994.
K. Rim et al., *Strained Si NMOSFET's for High Performance CMOS Technology*, VLSI Tech., pp. 59 and 60, 2001.
F. Ootsuka et al., *A Highly Dense, High-Performance 130nm node CMOS Technology for Large Scale System-on-a-Chip Applications*, IEDM Tech. Dig., pp. 575-578, 2000 article.
Shinya Ito et al., *Mechanical Stress Effect of Etch-Stop Nitride and its Impact on Deep Submicron Transistor Design*, IEDM Tech., Dig. pp. 247-250, 2000 article.
A. Shimizu et al., *Local Mechanical—Stress Control (LMC): A New Technique for CMOS—Performance Enhancement*, IEDM Tech. Dig., pp. 433-436, 2001 article.

* cited by examiner

*Primary Examiner*—T. N. Quach
(74) *Attorney, Agent, or Firm*—Haynes and Boone, LLP

(57) ABSTRACT

A method comprising providing a substrate having an NMOS device adjacent a PMOS device and forming a first stress layer over the NMOS and PMOS devices, wherein the first stress layer comprises a first tensile-stress layer or a compression-stress layer. An etch stop layer is formed over the first stress layer, and portions of the first stress layer and the etch stop layer are removed from over the NMOS device, leaving the first stress layer and the etch stop layer over the PMOS device. A second tensile-stress layer is formed over the NMOS device and over the first stress layer and the etch stop layer, and portions of the second tensile-stress layer and the etch stop layer are removed from over the PMOS device, leaving the second tensile-stress layer over the NMOS device.

30 Claims, 2 Drawing Sheets

CMOS DEVICE

BACKGROUND OF THE INVENTION

Mechanical stress control in the channel regions of metal-oxide semiconductor field-effect transistors (MOSFETs) enables overcoming the limitations incurred in the scaling down of devices.

U.S. Pat. No. 6,284,610 B1 to Cha et al. describes a poly layer to reduce stress.

U.S. Pat. No. 6,281,532 B1 to Doyle et al. describes processes to change the localized stress.

U.S. Pat. No. 5,562,770 to Chen et al. describes a process for global stress modification by forming layers or removing layers from over a substrate.

U.S. Pat. No. 5,834,363 to Masanori describes a method for global stress modification by forming layers from over a substrate.

The J. Welser et al. *Strain Dependence of the Performance Enhancement in Strained-Si n-MOSFETs*, IEDM Tech. Dig., pp. 373–376, 1994 article discloses measurements of the strain dependence of the electron mobility enhancements in n-MOSFETs employing tensilely-strained Si channels.

The K. Rim et al. *Strained Si NMOSFET's for High Performance CMOS Technology*, VLSI Tech., pp. 59 and 60, 2001 article describes performance enhancements in strained Si NMOSFET's at $L_{eff}$<70 nm.

The F. Ootsuka et al. *A Highly Dense, High-Performance 130 nm node CMOS Technology for Large Scale System-on-a-Chip Applications*, IEDM Tech. Dig., pp. 575–578, 2000 article describes a 130 nm node CMOS technology with a self-aligned contact system.

The Shinya Ito et al. *Mechanical Stress Effect of Etch-Stop Nitride and its Impact on Deep Submicron Transistor Design*, IEDM Tech, Dig.; pp. 247–250, 2000 article describes process-induced mechanical stress affecting the performance of short-channel CMOSFET's.

The A. Shimizu et al. *Local Mechanical-Stress Control (LMC): A New Technique for CMOS-Performance Enhancement*, IEDM Tech. Dig., pp. 433–436, 2001 article describes a "local mechanical-stress control" (LMC) technique used to enhance the CMOS current drivability.

SUMMARY OF THE INVENTION

Accordingly, it is an object of one or more embodiments of the present invention to provide a MOS/CMOS device having different stresses on at least two different areas, and methods of fabricating the same.

Other objects will appear hereinafter.

It has now been discovered that the above and other objects of the present invention may be accomplished in the following manner. Specifically, a structure having at least an adjacent NMOS device and PMOS device is provided. A first stress layer is formed over the PMOS device and a second stress layer is formed over the NMOS device whereby the mobility of holes and electrons within the structure is improved. A semiconductor device comprising: at least one NMOS device; at least one PMOS device adjacent the at least one NMOS device; a first stress layer overlying the at least one PMOS device with the first stress layer having a first stress characteristic; and a second stress layer overlying the at least one NMOS device with the second stress layer having a second stress characteristic.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Information Known to the Inventors—Not to be Considered Prior Art

The following information is known to the inventors and is not to be necessarily considered prior art for the purposes of this invention.

Changing the Si lattice spacing to a value other than the equilibrium value by using mechanical stress can increase the mobility of holes and electrons. This has been demonstrated in a strained-silicon (Si) MOSFET which applied high biaxial tensile stress to the channel of MOSFETs. However, the fabrication of strained-Si MOSFETs involves complicated processes such as forming a relaxed SiGe buffer layer. A recent study has shown that mechanical stress from a contact etch stop silicon nitride (SiN) layer affects the drive current.

Figure 1:
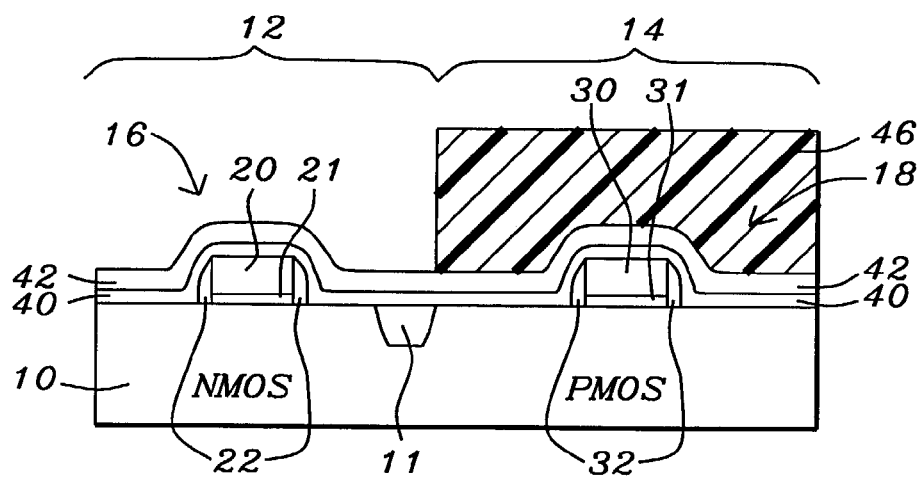
FIGS. 1 to 5 schematically illustrate a preferred embodiment of the present invention.

Initial Structure—FIG. 1 As shown in FIG. 1, the preferred structure of the present embodiment includes a structure 10 that preferably includes (1) at least one NMOS region 12 having at least one NMOS (N-type MOS) device 16 formed therein and (2) at least one PMOS region 14 having at least one PMOS (P-type MOS) device 18 formed therein.

An isolation device 11 may be formed within structure 10 between adjacent NMOS/PMOS devices 16, 18. Structure 10 may be a silicon substrate or a silicon-germanium substrate, for example, and isolation device 11 may be, for example, a shallow trench isolation (STI) device.

The NMOS devices(s) 16 comprise a respective electrode 20 and sidewall spacers 22, source/drain (S/D) implants (not shown) and a gate oxide layer 21. The PMOS devices(s) 18 comprise a respective electrode 30 and sidewall spacers 32, source/drain (S/D) implants (not shown) and a gate oxide layer 31. The respective gate oxide layers 21, 31 each have a thickness of preferably from about 6 to 100 Å and more preferably less than about 17 Å.

An NMOS device channel and a PMOS device channel may be formed (not shown). The respective device channels each have a design width of preferably from about 0.05 to 10.0 µm, more preferably less than about 10.0 µm and most preferably less than about 0.5 µm.

The operation voltage design is preferably from about 0.6 to 3.3 volts (V) and is more preferably less than about 1.2 V.

Structure 10 is preferably a silicon substrate or a germanium substrate, is more preferably a silicon substrate and is understood to possibly include a semiconductor wafer or substrate.

A first stress layer 40 is formed over structure 10, NMOS devices(s) 16 and PMOS device(s) 18 to a thickness of preferably from about 200 to 700 Å. First stress layer 40 may be either a tensile-stress layer or a compression-stress layer as described below.

An etch stop layer 42 is formed over the first stress layer 40 to a thickness of preferably from about 200 to 700 Å and more preferably from about 250 to 500 Å. Etch stop layer 42 is preferably comprised of oxide, silicon oxide ($SiO_2$) or SiON and is more preferably comprised of oxide or silicon oxide.

Figure 2:
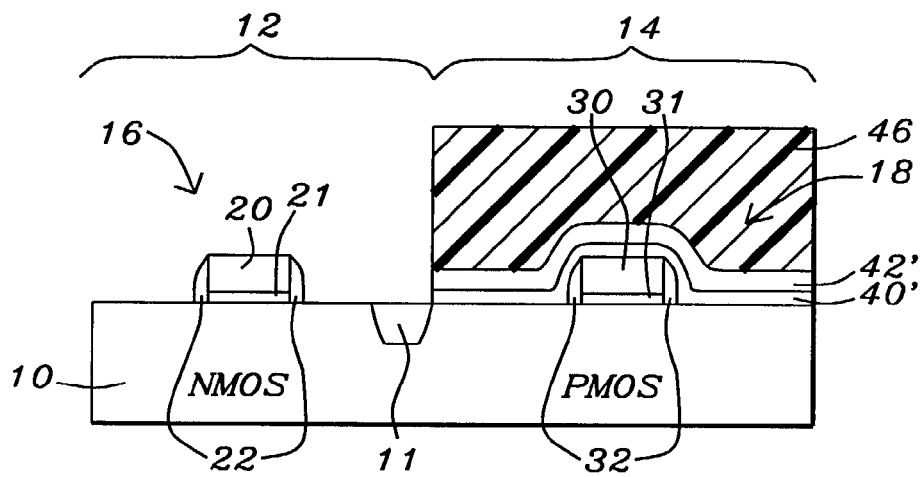

A first patterning layer 46 is formed at least over either the NMOS device 16 and adjacent thereto or, as shown in FIG. 1, the PMOS device 18 and adjacent thereto, to permit patterning of the etch stop layer 42 and the first stress layer 40. First patterning layer 46 is preferably comprised of photoresist, or a hardmask and more preferably photoresist as shown in FIGS. 1 and 2. Etch stop layer 42 may also be patterned by selective etching without using a first patterning layer 46.

Patterning of the Etch Stop Layer 42 and the First Stress Layer 40—FIG. 2

As shown in FIG. 2, preferably using first patterning layer 46 as a mask, the etch stop layer 42 and the first stress layer 40 are patterned to leave a patterned etch stop layer 42' and a patterned first stress layer 40' each at least overlying the PMOS device 18 and adjacent thereto within PMOS area 14, leaving the NMOS device 16 within NMOS area 12 exposed.

As one skilled in the art would understand now or hereafter, the first patterning layer 46 may not necessarily be needed to pattern the etch stop layer 42 and the first stress layer 40 as long as the etch stop layer 42 and the first stress layer 40 are patterned/etched as shown in FIG. 2.

Figure 3:
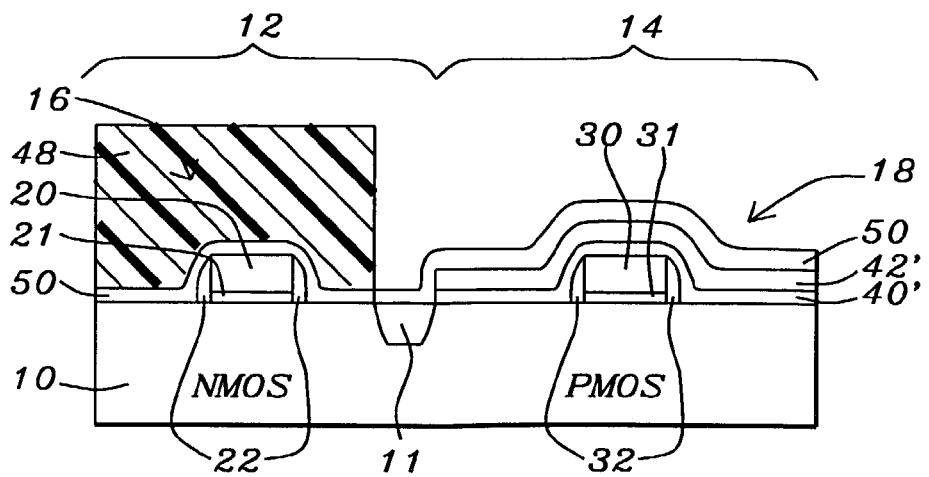

Formation of Second Stress Layer 50—FIG. 3

As shown in FIG. 3, the first patterning layer 46 (if used) is removed and the structure is cleaned as necessary.

A second stress layer 50 is formed over structure 10, NMOS device 16 and over patterned etch stop layer 42' that overlies at least PMOS device 18 and adjacent thereto to a thickness of preferably from about 200 to 700 Å. Second stress layer 50 is (1) a tensile-stress layer if the patterned first stress layer 40' is comprised of a tensile-stress layer and is a (2) a tensile-stress layer is the patterned first stress layer 40' is comprised of a compression-stress layer.

Figure 4:
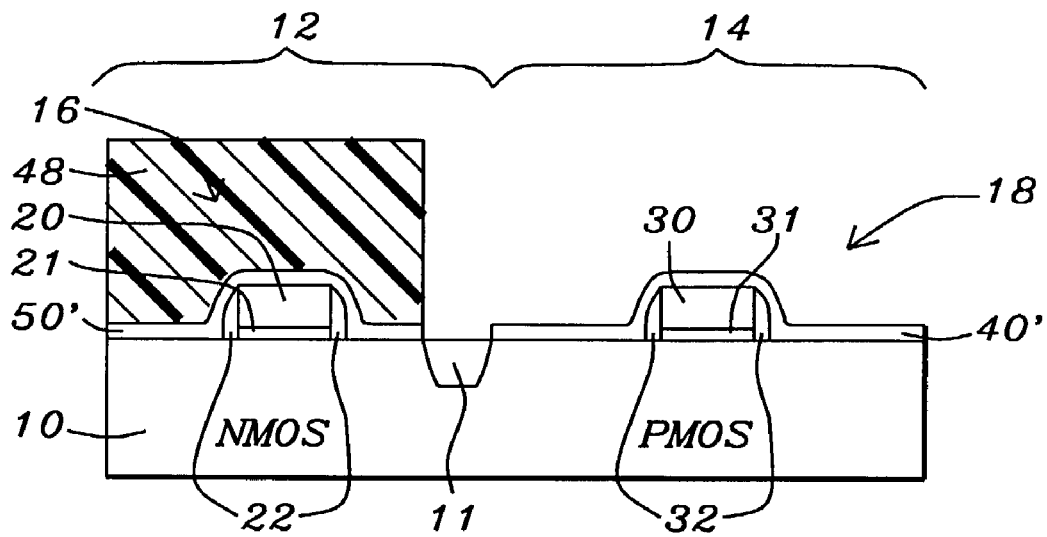

As shown in FIG. 3, a second patterning layer 48 is formed at least over the NMOS device 16 (if the first patterning layer 46 was formed over the PMOS device 18) and adjacent thereto to permit patterning of the second stress layer 50. Second patterning layer 48 is preferably comprised of photoresist or a hardmask and more preferably photoresist as shown in FIGS. 3 and 4. Second stress layer 50 may also be patterned by selective etching without using a first patterning layer 48.

Patterning of the Second Stress Layer 50—FIG. 4

As shown in FIG. 4, preferably using second patterning layer 48 as a mask: (1) the second stress layer 50 is patterned to leave a patterned second stress layer 50' at least overlying the NMOS device 16 and adjacent thereto within NMOS area 12; and (2) the patterned etch stop layer 42' is etched and removed leaving the patterned first stress layer 40' overlying at least the PMOS device 18 and adjacent thereto within PMOS area 14 exposed.

As one skilled in the art would understand now or hereafter, the second patterning layer 48 may not necessarily be needed to pattern the second stress layer 50 et al. as long as the second stress layer 50 et al. are patterned/etched as shown in FIG. 4.

Figure 5:
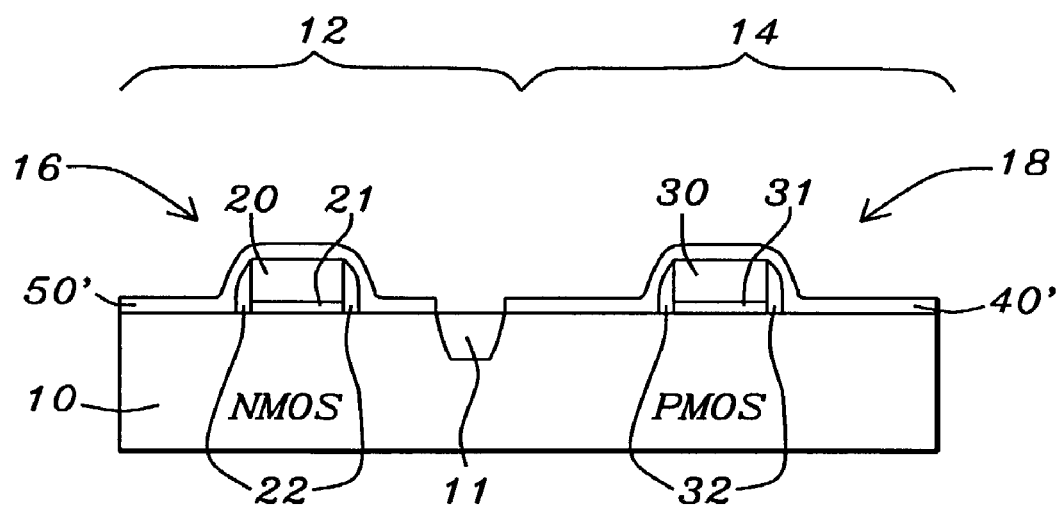

Removal of the Second Patterning Layer 48—FIG. 5

As shown in FIG. 5, the second patterning layer 48 (if used) is removed and the structure is cleaned as necessary.

Formation of Tensile-stress Layers and Compression-stress Layers

As noted above, the first stress layer 40 may be either a tensile-stress layer or a compression-stress layer while the second stress layer 50 is a tensile-stress layer. That is, if the first stress layer 40 is a tensile-stress layer then the second stress layer 50 is a tensile-stress layer, and if the first stress layer 40 is a compression-stress layer then the second stress layer 50 is a tensile-stress layer as illustrated by the following table:

|  | Case 1 | Case 2 |
| --- | --- | --- |
| First Stress layer 40' | tensile-stress | compression-stress |
| Second Stress layer 50' | tensile-stress | tensile-stress |

The tensile-stress layer, be it first stress layer 40 or second stress layer 50, is preferably comprised of silicon nitride ($Si_3N_4$ or just SiN), silicon oxynitride (SiON), oxide or Si-rich nitride, is more preferably SiN or SiON and is most preferably SiON and has a thickness of preferably from about 200 to 1000 Å and more preferably from about 250 to 500 Å. The tensile-stress layer is preferably deposited by rapid thermal chemical vapor deposition (RTCVD) under the following conditions:

temperature: preferably from about 350 to 800° C. and more preferably from about 400 to 700° C.;

time: preferably from about 10 to 2000 seconds and more preferably from about 20 to 120 seconds;

$NH_3$:$SiH_4$ gas ratio: preferably from about 50:1 to 400:1 and more preferably less than about 700:1; or di-saline: $NH_3$ gas ratio: preferably from about 1:40 to 1:500 and more preferably less than about 1:1; and deposition pressure: preferably from about 10 to 400 Torr and more preferably less than about 300 Torr.

The compression-stress layer, which may be first stress layer 40, is preferably comprised of silicon nitride ($Si_3N_4$ or just SiN), silicon oxynitride (SiON), oxide or Si-rich nitride, is more preferably SiN or SiON and is most preferably SiON and has a thickness of preferably from about 200 to 1000 Å and more preferably from about 250 to 500 Å. The compression-stress layer is preferably deposited by plasma enhanced chemical vapor deposition (PECVD) under the following conditions:

temperature: preferably from about 300 to 600° C. and more preferably less than about 600° C.;

time: preferably from about 10 to 500 seconds and more preferably from about 20 to 120 seconds;

$NH_3$:$SiH_4$ gas ratio: preferably from about 4:1 to 10:1 and more preferably less than about 8:1; or di-saline:$NH_3$ gas ratio: preferably from about 1:4 to 1:10 and more preferably less than about 1:1;

deposition pressure: preferably from about 1.0 to 1.5 Torr and more preferably less than about 1.5 Torr; and total power: preferably from about 1000 to 2000 watts (W) and more preferably greater than about 1000 W.

The different stresses achieved by using either a first tensile-stress layer 40'/second compression-stress layer 50' combination or a first compression-stress layer 40'/second tensile-stress layer 50'teachings of the present invention increases the mobility of holes and electrons.

Advantages of the Present Invention

The advantages of one or more embodiments of the present invention include:
1. using a specific tensile film to improve N, PMOS; and
3. provide a method to attain PMOS on compressive stress and NMOD on tensile stress to improve N, PMOS device performance.

While particular embodiments of the present invention have been illustrated and described, it is not intended to limit the invention, except as defined by the following claims.

We claim:

1. A method, comprising:
providing a substrate having an NMOS device adjacent a PMOS device;
forming a first stress layer over the NMOS and PMOS devices, the first stress layer comprising one of a first tensile-stress layer and a compression-stress layer;
forming an etch stop layer over the first stress layer;
removing the first stress layer and the etch stop layer from over the NMOS device, leaving the first stress layer and the etch stop layer over the PMOS device;
forming a second tensile-stress layer over the NMOS device and over the first stress layer and the etch stop layer over the PMOS device; and
removing the second tensile-stress layer and the etch stop layer from over the PMOS device, leaving the second tensile-stress layer over the NMOS device.

2. The method of claim 1 wherein the substrate comprises silicon-germanium.

3. The method of claim 1 wherein at least one of the first stress layer and the second tensile-stress layer comprises SiON.

4. The method of claim 1 wherein:
the one is the first tensile-stress layer;
forming the first stress layer includes forming the first stress layer by rapid thermal chemical-vapor deposition (RTCVD) processing; and
forming the second tensile-stress layer includes forming the second tensile-stress layer by rapid thermal chemical-vapor deposition (RTCVD) processing.

5. The method of claim 4 wherein process parameters of the RTCVD processing include a temperature ranging between about 400° C. and about 700° C., a time period ranging between about 20 seconds and about 120 seconds, and a pressure ranging between about 10 Torr and about 400 Torr.

6. The method of claim 1 wherein:
the one is the compression-stress layer;
forming the first stress layer includes forming the first stress layer by plasma-enhanced chemical-vapor deposition (PECVD) processing; and
forming the second tensile-stress layer includes forming the second tensile-stress layer by rapid thermal chemical-vapor deposition (RTCVD) processing.

7. The method of claim 6 wherein process parameters of the RTCVD processing include a temperature ranging between about 400° C. and about 700° C., a time period ranging between about 20 seconds and about 120 seconds, and a pressure ranging between about 10 Torr and about 400 Torr.

8. The method of claim 7 wherein process parameters of the PECVD processing include a temperature ranging between about 300° C. and about 600° C., a time period ranging between about 20 seconds and about 120 seconds, and a pressure ranging between about 1.0 Torr and about 1.5 Torr.

9. The method of claim 8 wherein the RTCVD process parameters include an NH3:Si4 gas ratio ranging between about 50:1 and about 400:1 and the PECVD process parameters include an NH3:SiH4 gas ratio ranging between about 4:1 and about 10:1

10. The method of claim 1 wherein:
removing the first stress layer from over the NMOS device includes forming a patterning layer over the PMOS device and not over the NMOS device; and
removing the second tensile-stress layer from over the PMOS device includes forming a patterning layer over the NMOS device and not over the PMOS device.

11. The method of claim 1 wherein at least one of the first stress layer and the second tensile-stress layer comprises silicon oxynitride.

12. The method of claim 1 wherein:
forming the first stress layer includes forming the first stress layer by plasma-enhanced chemical-vapor deposition (PECVD) processing.

13. The method of claim 1 wherein:
forming the second tensile-stress layer includes forming the second tensile-stress layer by rapid thermal chemical-vapor deposition (RTCVD) processing.

14. A method, comprising:
forming a first stress layer over at least one of an NMOS device and a PMOS device each located in a substrate, the first stress layer comprising one of a first tensile-stress layer and a compression-stress layer;
forming an etch stop layer over at least a portion of the first stress layer;
removing at least a portion of the first stress layer and the etch stop layer from over at least the NMOS device, leaving at least a portion of the first stress layer and at least a portion of the etch stop layer over at least a substantial portion of the PMOS device;
forming a second stress layer over at least one of the NMOS device and the first stress layer, the second stress layer comprising a second tensile-stress layer; and
removing at least a portion of the second stress layer from over at least the PMOS device, leaving at least a portion of the second stress layer over at least a substantial portion of the NMOS device.

15. The method of claim 14 wherein the NMOS device is one of a plurality of NMOS devices each located in the substrate and the PMOS device is one of a plurality of PMOS devices each located in the substrate.

16. The method of claim 14 wherein the substrate comprises silicon-germanium.

17. The method of claim 14 wherein the first stress layer and the second stress layer each comprise silicon nitride.

18. The method of claim 14 wherein the first stress layer and the second stress layer each comprise silicon oxynitride.

19. The method of claim 14 wherein forming the first stress layer includes rapid thermal chemical-vapor deposition (RTCVD) processing.

20. The method of claim 14 wherein forming the second stress layer includes rapid thermal chemical-vapor deposition (RTCVD) processing.

21. The method of claim 14 wherein forming the second stress layer includes plasma-enhanced chemical-vapor deposition (PECVD) processing.

22. The method of claim 14 wherein forming the first stress layer includes rapid thermal chemical-vapor deposition (RTCVD) processing and forming the second stress layer includes plasma-enhanced chemical-vapor deposition (PECVD) processing.

23. The method of claim 14 wherein forming the first stress layer includes rapid thermal chemical-vapor deposition (RTCVD) processing and forming the second stress layer includes RTCVD processing.

24. The method of claim 14 wherein the one of the first tensile-stress layer and the compression-stress layer is the compression-stress layer.

25. The method of claim 24 wherein the first stress layer and the second stress layer each comprise one of silicon nitride and silicon oxynitride.

26. The method of claim 24 wherein forming the first stress layer includes rapid thermal chemical-vapor deposition (RTCVD) processing and forming the second stress layer includes plasma-enhanced chemical-vapor deposition (PECVD) processing.

27. The method of claim 14 wherein the one of the first tensile-stress layer and the compression-stress layer is the first tensile-stress layer.

28. The method of claim 27 wherein the first stress layer and the second stress layer each comprise one of silicon nitride and silicon oxynitride.

29. The method of claim 27 wherein forming the first stress layer includes rapid thermal chemical-vapor deposition (RTCVD) processing and forming the second stress layer includes RTCVD processing.

30. The method of claim 14 wherein forming the second stress layer includes forming the second stress layer over at least a portion of the NMOS device, at least a portion of the first stress layer, and at least a portion of the etch stop layer over the PMOS device, and wherein removing at least a portion the second stress layer includes removing at least a portion of the etch stop layer.

* * * * *